(12) United States Patent
Prentice et al.

(10) Patent No.: US 7,404,861 B2
(45) Date of Patent: Jul. 29, 2008

(54) IMAGING AND INSPECTION SYSTEM FOR A DISPENSER AND METHOD FOR SAME

(75) Inventors: Thomas C. Prentice, Westford, MA (US); David P. Prince, Wakefield, RI (US)

(73) Assignee: Speedline Technologies, Inc., Franklin, MA (US)

( * ) Notice: Subject to any disclaimer, the term of this patent is extended or adjusted under 35 U.S.C. 154(b) by 0 days.

(21) Appl. No.: 10/831,468

(22) Filed: Apr. 23, 2004

(65) Prior Publication Data

US 2005/0235913 A1    Oct. 27, 2005

(51) Int. Cl.
B05C 11/00 (2006.01)
B05B 13/02 (2006.01)
B05B 3/00 (2006.01)

(52) U.S. Cl. ........................ 118/713; 118/665; 118/305; 118/323

(58) Field of Classification Search ................ 118/712, 118/713, 300, 663, 665, 681, 708, 323, 305; 427/8, 9, 424, 427.1, 427.2, 427.3; 356/601, 356/630
See application file for complete search history.

(56) References Cited

U.S. PATENT DOCUMENTS

| | | | |
|---|---|---|---|
| 5,052,338 A | | 10/1991 | Maiorca et al. |
| 5,760,907 A | * | 6/1998 | Basler et al. ................ 356/390 |
| 5,956,134 A | * | 9/1999 | Roy et al. ................ 356/237.5 |
| 5,985,357 A | * | 11/1999 | Sanada ........................... 427/8 |
| 6,093,251 A | | 7/2000 | Carr et al. |
| 6,214,117 B1 | | 4/2001 | Prentice et al. |
| 6,266,869 B1 | * | 7/2001 | Tracy et al. .................... 29/740 |
| 6,514,569 B1 | | 2/2003 | Crouch |
| 6,541,063 B1 | | 4/2003 | Prentice et al. |
| 6,678,062 B2 | | 1/2004 | Haugen et al. |
| 6,866,881 B2 | | 3/2005 | Prentice et al. |
| 2002/0020350 A1 | | 2/2002 | Prentice et al. |
| 2004/0005403 A1 | * | 1/2004 | Nesbitt ........................... 427/8 |
| 2004/0011284 A1 | * | 1/2004 | Schucker ..................... 118/688 |
| 2004/0105001 A1 | * | 6/2004 | Chang et al. ................... 348/92 |

(Continued)

FOREIGN PATENT DOCUMENTS

DE    91 10 924 U1    10/1991

(Continued)

OTHER PUBLICATIONS

Merkling, Harold M., "Scheimpflug's Patent", published in Photo Techniques, Nov./Dec. 1996, 3 pgs.

(Continued)

Primary Examiner—Yewebdar T Tadesse
(74) Attorney, Agent, or Firm—Lowrie, Lando & Anastasi, LLP

(57) ABSTRACT

Aspects of the invention are directed to systems and methods for dispensing materials onto a substrate. In one aspect, a dispensing system includes a dispenser having a dispensing outlet positionable over a top surface of the substrate, the dispenser having a substantially vertical dispensing axis along which material from the dispenser is dispensed, and a vision system, coupled to the dispenser, the vision system being positionable to obtain images of the top surface of the substrate along an optical axis, wherein the vision system is constructed and arranged such that the optical axis intersects the dispensing axis.

12 Claims, 15 Drawing Sheets

U.S. PATENT DOCUMENTS

2006/0251797 A1 * 11/2006 Erfle et al. .................. 427/8

FOREIGN PATENT DOCUMENTS

| EP | 0 289 421 A2 | 11/1988 |
| EP | 0 427 362 A2 | 5/1991 |
| GB | 1139/1901 | 0/1901 |
| GB | 1196/1904 | 0/1904 |
| WO | WO 2004026490 A1 * | 4/2004 |

OTHER PUBLICATIONS

International Search Report for PCT/US2005/013763 mailed Nov. 18, 2005.

* cited by examiner

IMAGING AND INSPECTION SYSTEM FOR A DISPENSER AND METHOD FOR SAME

FIELD OF THE INVENTION

The invention relates generally to a system and method for acquiring and analyzing images of a substrate and of material dispensed onto the substrate. Specifically, this system relates to an off-axis imaging system and associated image processing methods that together sense the height of the substrate at the point of dispense and detect and inspect materials dispensed upon the substrate.

BACKGROUND OF THE INVENTION

There are several types of prior art dispensing systems used for dispensing metered amounts of liquid or paste for a variety of applications. One such application is the assembly of integrated circuit chips and other electronic components onto circuit board substrates. In this application, automated dispensing systems are used for dispensing dots of liquid epoxy or solder paste onto the circuit board substrates. The liquid epoxy and solder paste are used to mechanically and electrically connect components to a circuit board substrate. In such dispensing systems, it is typical that an alignment vision system is used to locate certain features on a substrate for the purpose of aligning the dispensing operations relative to certain features on the substrate. Exemplary dispensing systems are manufactured and distributed by Speedline Technologies, Inc. of Franklin, Mass.

It is also known in the field of automated dispensers to use the alignment vision system or another vision system to inspect the results of the dispense process. Typically, the optic axis of alignment or inspection vision systems are constructed and arranged to be substantially normal to the substrate. The direction normal to the substrate is typically referred to as a Z-axis. In conventional prior art cameras, this axis-normal configuration serves to maximize the focus across the field of view and to minimize the amount of distortion introduced. It is also typical that the dispenser in a dispensing system is constructed and arranged to be substantially normal to the substrate surface. This axis-normal configuration of the dispenser serves to maximize the quality and repeatability of the resultant dispensed material formation.

However, a consequence of having both the vision system and the dispenser arranged normal to the substrate as described is that they cannot both operate on the same substrate location at the same time. Accordingly, the center of the imaging system's field of view and the point of dispense are typically displaced laterally from each other.

Also typically included in conventional dispensing systems is a means for measuring the height of the substrate in the Z-axis. In some height measuring systems, physical contact is made between the measuring system and the surface to be measured. One such prior art height measuring system is described in U.S. Pat. No. 6,093,251 entitled "Apparatus for Measuring the Height of a Substrate in a Dispensing System", which is incorporated herein by reference, and is assigned to the assignee of the present application. In other prior art height measuring systems, a laser light source and an optical sensing system are combined to measure the position of an object without making physical contact. Examples of such non-contact measuring systems include those manufactured and distributed by Micro-Epsilon of Ortenburg, Germany.

In such dispensing systems, whether the height measurement system incorporated is of the contact type or the non-contact type, it is typical that the point of height sensing is laterally displaced from the point of dispense.

As a consequence of the lateral offsets described above, movement times are associated with performing either height measurement or dispense inspection operations. As such, the throughput of the dispensing system is negatively impacted by frequent substrate height measurements or by frequent dispense inspection operations.

An additional consequence of the lateral offsets described above is the possible introduction of additional error mechanisms in the performance of certain types of calibration operations. For example, typically, precision positioning systems, such as those utilized in automated dispensing systems, are "mapped" as part of the manufacturing process. This mapping operation typically uses a vision system and a precision reference grid to learn and thus compensate for positioning errors in the positioning system. The precision reference grid may be of a chrome-on-glass type, well known to those skilled in the art, or an equivalent high-contrast grid on a suitable mechanically stable substrate. Examples of precision reference grids include those manufactured and distributed by Max Levy Autograph, Inc. of Philadelphia, Pa. The precision reference grid is placed in the machine under the view of the vision system, and the precision positioning system is commanded to move to a multitude of locations. At each location, the precision reference grid is viewed via the vision system, and the resultant image appropriately analyzed to determine the actual position achieved. By comparing the commanded positions with the actual positions achieved, positioning errors in the precision positioning system may be determined and saved. The learned positioning errors may then be applied to subsequent commanded positions to compensate for the positioning errors. However, if there are lateral offsets between the point where mapping is performed and the point where dispensing operations occur, and if any roll, pitch or yaw errors exist in the precision positioning system, then residual errors, commonly known as Abbe errors, may still remain unmeasured and thus uncompensated for.

SUMMARY OF THE INVENTION

A first aspect of the invention is directed to a dispensing system for dispensing materials onto a substrate. The dispensing system includes a dispenser having a dispensing outlet positionable over a top surface of the substrate, the dispenser having a substantially vertical dispensing axis along which material from the dispenser is dispensed, and a vision system, coupled to the dispenser, the vision system being positionable to obtain images of the top surface of the substrate along an optical axis, wherein the vision system is constructed and arranged such that the optical axis intersects the dispensing axis.

The dispensing system may further include a light source coupled to the dispenser and constructed and arranged to direct light along an illumination axis that intersects the dispensing axis and the optical axis. The dispensing system may be constructed and arranged such that the top surface of the substrate at a dispensing position in the dispensing system is substantially horizontal and an angle between the optical axis and the top surface of the substrate is substantially equal to an angle between the illumination axis and the top surface of the substrate. The vision system may include a telecentric lens configuration. The light source may be configured to generate a fan of rays along a line on the top surface of the substrate. The light source may be configured to generate a parallel set of rays and may include a laser. The dispensing system may include a gantry system coupled to the dispenser and the vision system to position the dispenser and the vision system over the top surface of the substrate. The dispensing system may further include a controller coupled to the dispenser and the vision system, the controller being configured to control dispensing parameters of the dispenser and to control the vision system and acquire images from the vision system. The controller and the vision system may be configured to measure a height of at least one point on the top surface of the substrate. The controller and the vision system may be configured to capture an image of a drop of material dispensed onto the substrate and to determine at least one parameter of the drop of material. The at least one parameter may be at least one of a height of the drop, a diameter of the drop, a volume of the drop, and a location of the drop on the substrate. The controller may be configured to compare the at least one parameter with a predetermined boundary for the at least one parameter to obtain a comparison result, and to adjust the dispensing parameters based on the comparison result. The vision system may include a detector having a detector plane that forms a first acute angle with the optical axis, wherein the first acute angle is substantially equal to a second acute angle between the optical axis and the top surface of the substrate.

A second aspect of the invention is also directed to a dispensing system for dispensing materials onto a substrate. The dispensing system includes a dispenser having a dispensing outlet positionable over a top surface of the substrate while the substrate is located at a dispensing position in the dispensing system, the dispenser having a substantially vertical dispensing axis along which material from the dispenser is dispensed, and means, coupled to the dispenser, for capturing an image of a portion of the substrate disposed under the dispensing outlet.

The dispensing system may include means for illuminating the portion of the substrate disposed under the dispensing outlet and may also include means for determining a height of at least one point on a top surface of the substrate. The means for capturing an image may include means for capturing an image of a drop of material dispensed onto the substrate and for determining at least one parameter of the drop of material. The dispensing system may further include means for comparing the at least one parameter with a predetermined boundary for the at least one parameter to obtain a comparison result, and to adjust the dispensing parameters based on the comparison result.

Another aspect of the invention is directed to a method of dispensing material onto a substrate using a dispensing system. The method includes loading a substrate into the dispensing system, the substrate having a top surface onto which material is to be dispensed, positioning a dispenser over a portion of the substrate, dispensing a drop of material onto the substrate, and capturing an image of the portion of the substrate while the dispenser is positioned over the portion of the substrate, wherein the image is captured using a vision system having an optical axis that forms a first acute angle with the top surface of the substrate.

The method may further include directing light along an illumination axis towards the portion of the substrate. The illumination axis may intersect the optical axis and form a second acute angle with the top surface of the substrate, the first acute angle being equal to the second acute angle. In the method, directing light may include directing a fan of parallel rays along a line on the top surface of the substrate. The method may further include measuring a height of at least one point on the top surface of the substrate based on the image. In the method, capturing an image may include capturing an image of the drop of material. The method may further include determining at least one parameter of the drop of material. The at least one parameter may include at least one of a height of the drop, a diameter of the drop, a volume of the drop, and a location of the drop on the substrate. The method may further include adjusting at least one parameter of the dispensing system based on the at least one parameter of the drop of material. In the method, capturing an image may include capturing a first image prior to dispensing a drop of material, capturing a second image after dispensing the drop of material, subtracting the first image from the second image to obtain a third image, and determining at least one parameter of the drop of material using the third image.

The present invention will be more fully understood after a review of the following figures, detailed description and claims.

BRIEF DESCRIPTION OF THE DRAWINGS

For a better understanding of the present invention, reference is made to the figures, which are incorporated herein by reference and in which.

DETAILED DESCRIPTION

Figure 1A:
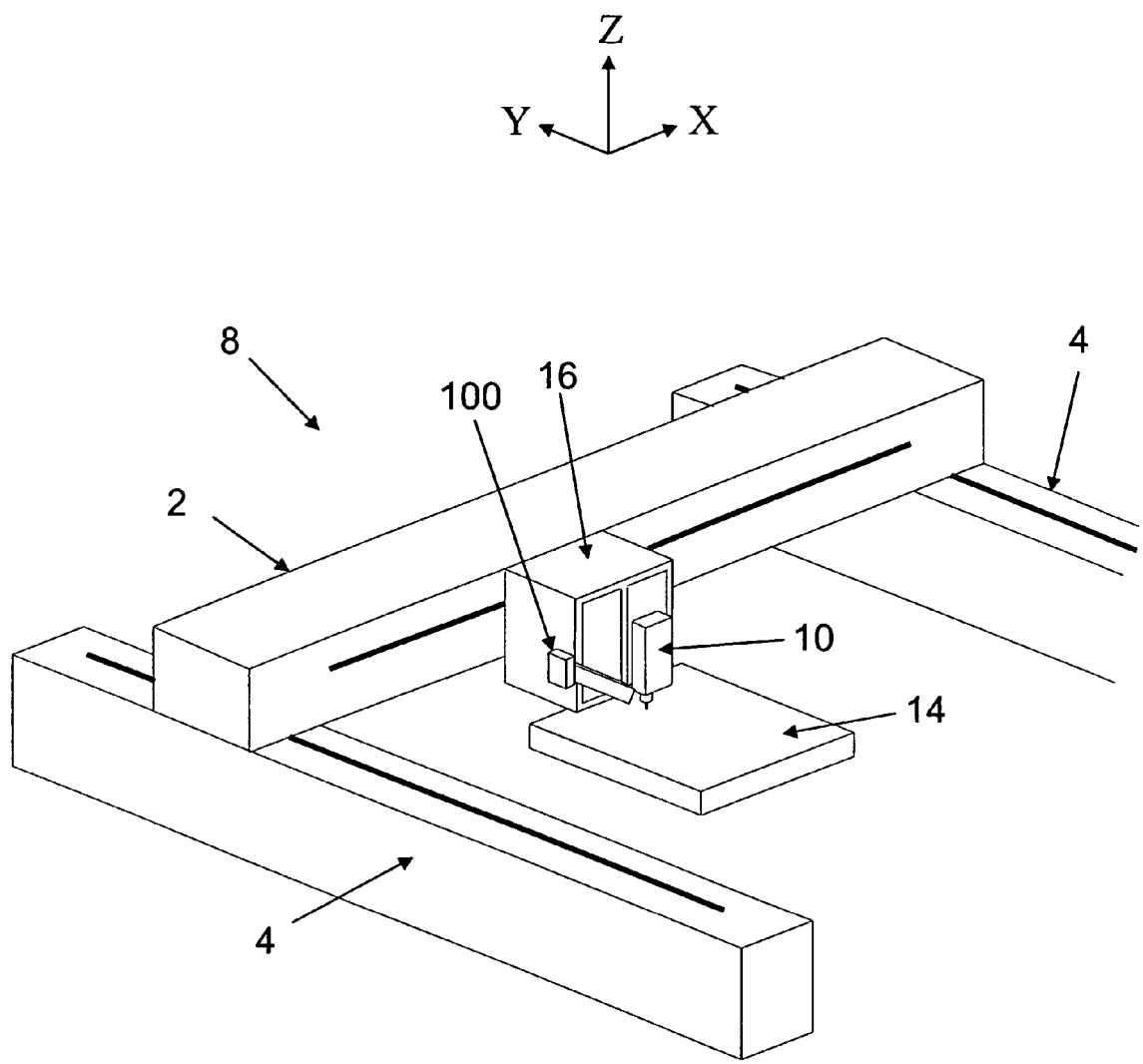
FIG. 1A is a perspective view of a dispensing platform in accordance with one embodiment of the invention.

For purposes of illustration only, and not to limit the generality, the present invention will now be described in detail with reference to the accompanying figures. This invention is not limited in its application to the details of construction and the arrangement of components set forth in the following description or illustrated in the drawings. The invention is capable of other embodiments and of being practiced or being carried out in various ways. Also the phraseology and terminology used herein is for the purpose of description and should not be regarded as limiting. The use of "including," "comprising," "having," "containing," "involving," and variations thereof herein, is meant to encompass the items listed thereafter and equivalents thereof as well as additional items.

FIG. 1A depicts a dispensing platform 8 used in dispensing systems in accordance with embodiments of the present invention. The dispensing platform 8 includes a dispenser 10, a dispense head housing 16, an imaging system 100, and a gantry system that includes a gantry beam 2 and gantry rails 4. The dispenser 10 and the imaging system 100 are mounted to the dispense head housing 16. The dispense head housing 16 is slidably mounted along an X axis to the gantry beam 2, which is itself slidably mounted along a Y axis to the gantry rails 4. A substrate 14 is shown in a working position under the dispenser 10 and the imaging system 100.

Figure 1B:
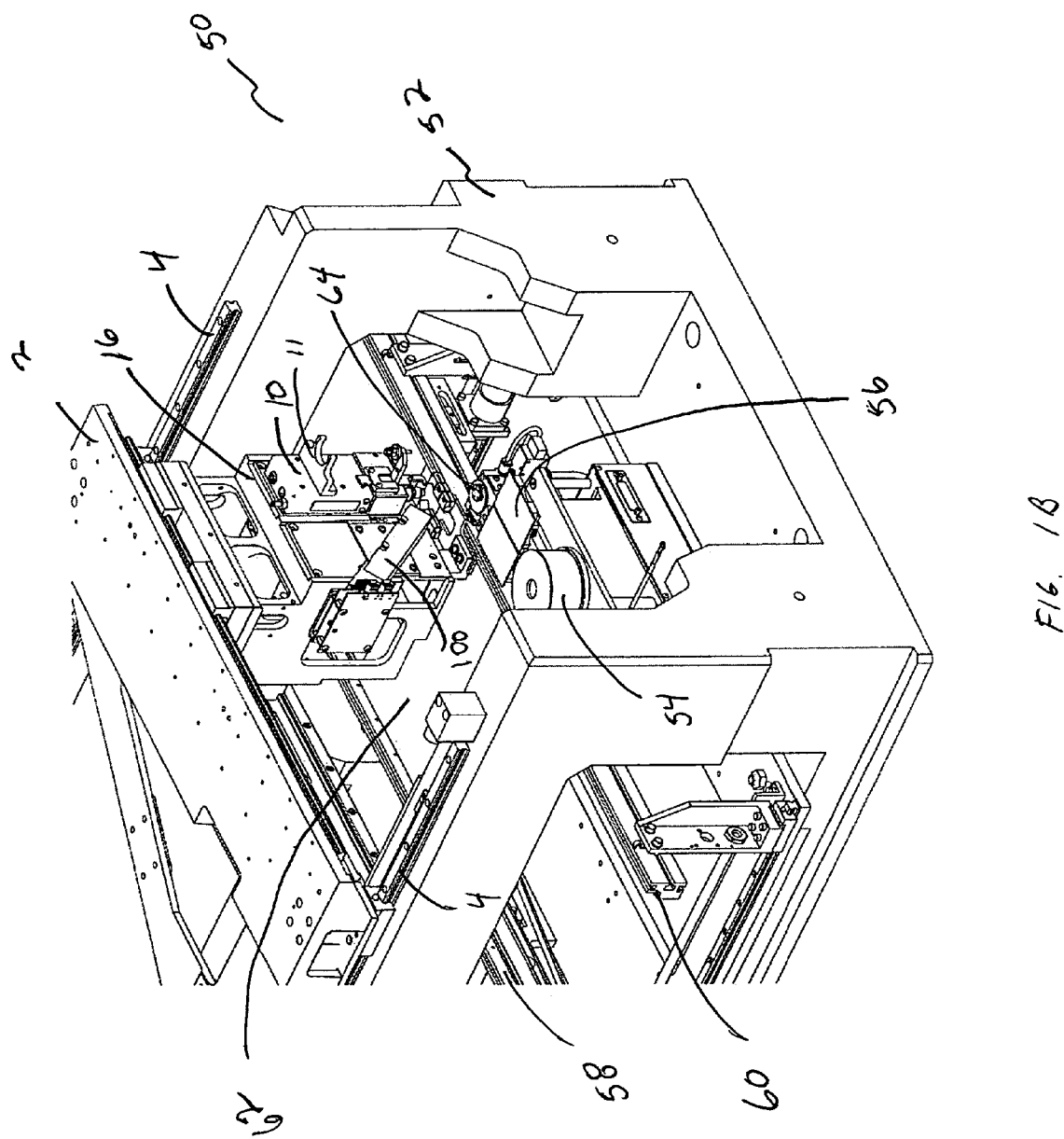
FIG. 1B is a partial perspective view of a dispensing system incorporating the dispensing platform of FIG. 1A.

FIG. 1B shows a partial view of a dispensing system 50 incorporating the dispensing platform 8 of FIG. 1A. In the dispensing system 50 of FIG. 1B, for clarity, the dispenser 10 is shown without a syringe of material, which typically would be mounted in a syringe bracket 11 of the dispenser 10.

The dispensing system 50 includes a frame 52 for supporting components of the system, and also includes a weigh scale 54, a predispense platform 56, conveyor rails 58, 60, and a needle cleaner 64. The weigh scale 54 may be used in embodiments of the present invention to provide calibration of the dispensing system, and the predispense platform may be used prior to a dispense or calibration operation to ensure that the dispenser 10 is properly loaded with material. The conveyor rails 58 and 60 are used to load substrates into the dispensing system 50, and to position them at a dispense position 62 beneath the gantry system.

The needle cleaner 64 is used to remove excess material from a dispensing needle of the dispenser 10, and in one embodiment may be implemented using a needle cleaning system described in U.S. patent application Ser. No. 09/974,022, filed Oct. 10, 2001, entitled "Needle Cleaning System," assigned to the assignee of the present application, and incorporated herein by reference.

Figure 2:
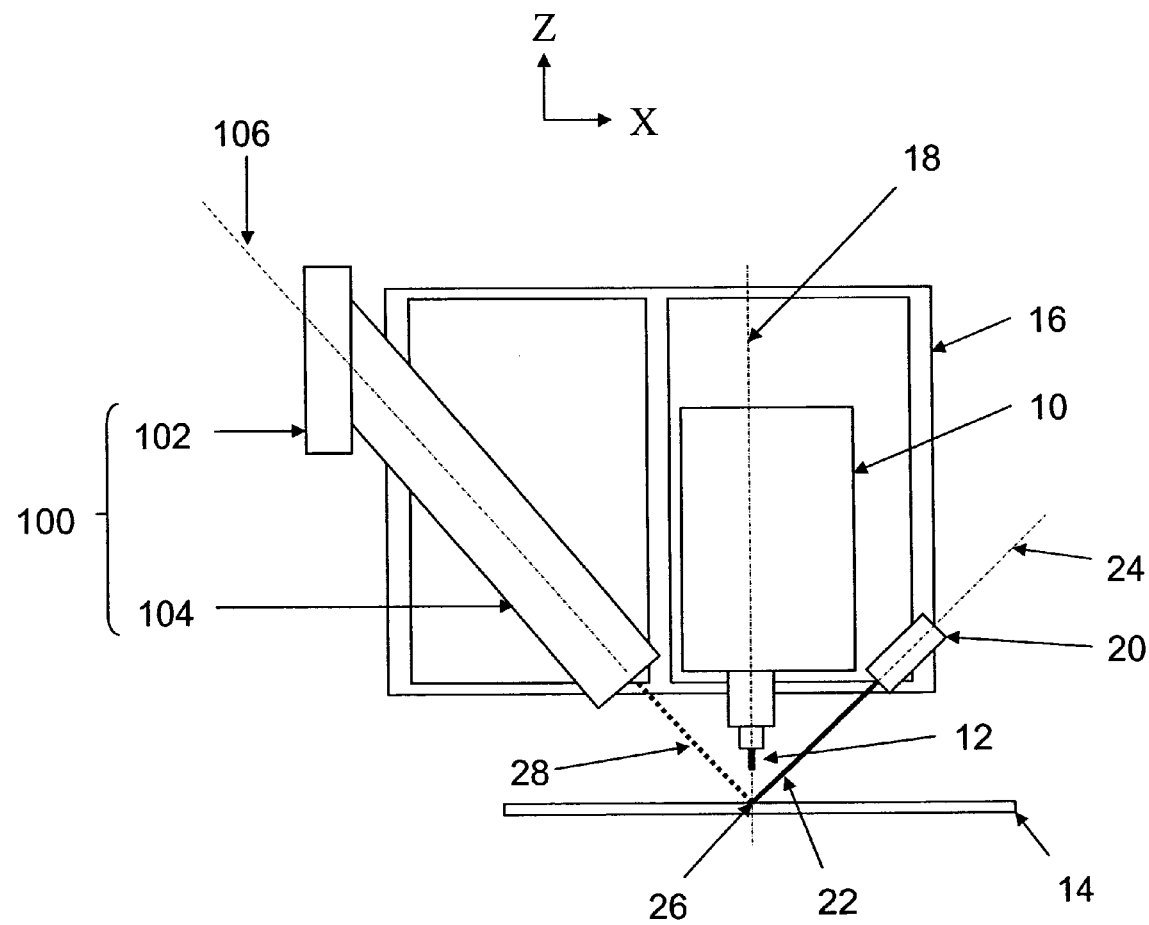
FIG. 2 is a front view of the dispensing and imaging portions of a dispensing system in accordance with one embodiment of the invention.

FIG. 2 depicts the dispensing and imaging portions of the dispensing platform 8 in greater detail. Imaging system 100 is comprised of a camera 102 coupled to a lens assembly 104. The imaging system 100 and dispenser 10 are mounted to the dispensing head housing 16. The dispenser 10 is mounted such that a dispenser motion axis 18 coincides with the Z axis and as such, is substantially normal to the top surface of substrate 14. The intersection of the dispenser motion axis 18 and the top surface of substrate 14 defines a point of dispense 26. To perform a dispense operation, dispense head housing 16 is positioned along the X and Y axes such that the dispenser 10 is positioned above the proper location on substrate 14. The dispense needle 12 is then lowered along dispenser motion axis 18 towards substrate 14, material is caused to be dispensed onto substrate 14 from dispense needle 12 at the point of dispense 26, and the dispense needle 12 is then raised away from substrate 14 along dispenser motion axis 18. In embodiments of the invention, the dispenser may be implemented using one of a number of dispensers, such as those described in U.S. Pat. No. 6,214,117, entitled "Dispensing System and Method," and U.S. Pat. No. 6,514,569, entitled "Variable Volume Positive Displacement System and Method," both of which are incorporated herein be reference, and those available from Speedline Technologies, Inc. of Frankin, Mass.

The imaging system 100 is mounted such that the field of view of the camera system includes the point of dispense 26 and the immediate vicinity thereby. Also mounted to the dispensing head housing 16 is a laser light source 20, arranged such that light 22 is directed at the point of dispense 26 along laser axis 24. With the components thus arranged, light 22 from laser light source 20 is reflected off of the top surface of substrate 14 such that a reflected portion 28 is reflected along the optical axis 106 and viewed by the imaging system 100. In some embodiments of the present invention, in addition to the laser light source 20, a second illuminator may be used to provide further illumination of substrates and material dispensed. The second illuminator may include, for example, a ring of light emitting diodes or fiber optic light sources disposed around or adjacent to the dispensing needle to direct light towards the substrate.

Figure 3:
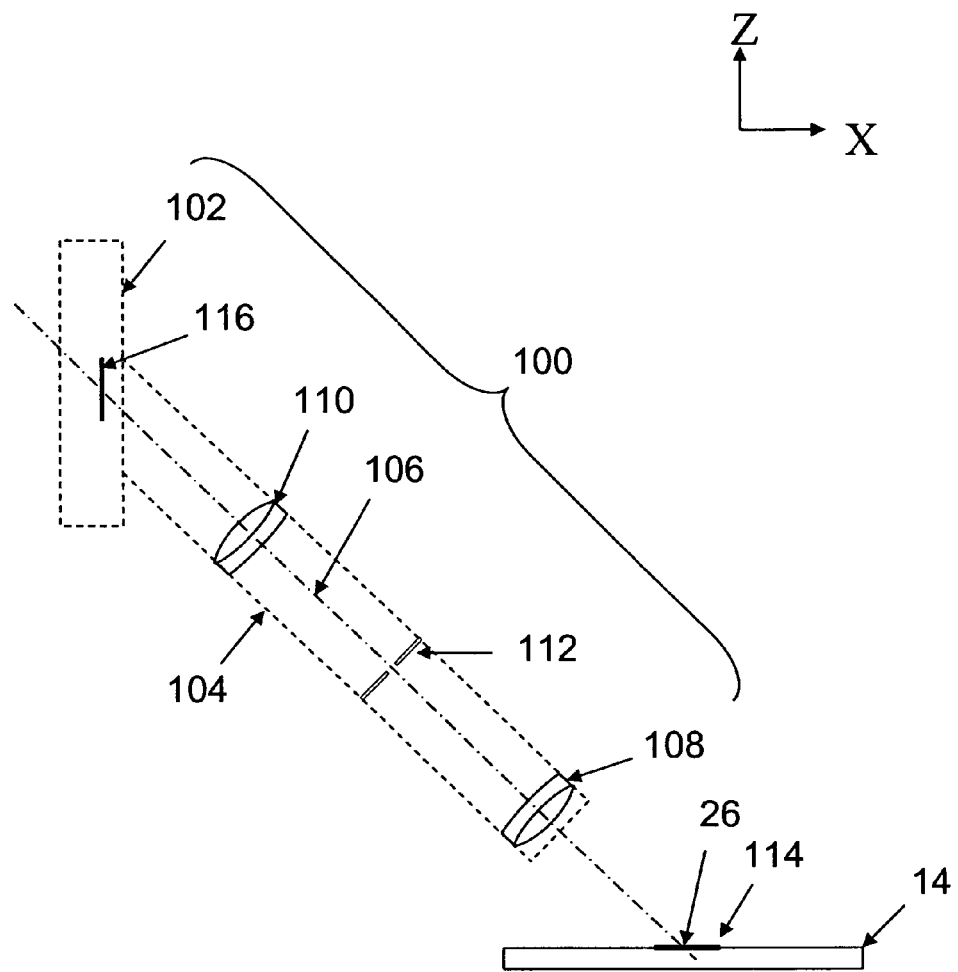
FIG. 3 is a schematic diagram of an imaging system in accordance with one embodiment of the invention.

FIG. 3 depicts the components comprising imaging system 100. Field of view 114 of the imaging system 100 is imaged by the lens assembly 104 onto detector 116 in camera 102. In one embodiment of the present invention, lens assembly 104 is comprised of two lenses 108 and 110 and aperture stop 112. The lenses may be of the cemented doublet achromatic type, well known to those skilled in the art and available from many optical component manufacturers, including Melles Griot of Irvine, Calif. The camera 102 may be of a digital type, such as those available from PixeLINK of Ottawa, Ontario. Lenses 108 and 110 and aperture stop 112 are arranged along optical axis 106. In other embodiments of the present invention, first surface mirrors may be incorporated into the imaging system to fold the optical path as required by the physical packaging constraints of the system.

Figure 4:
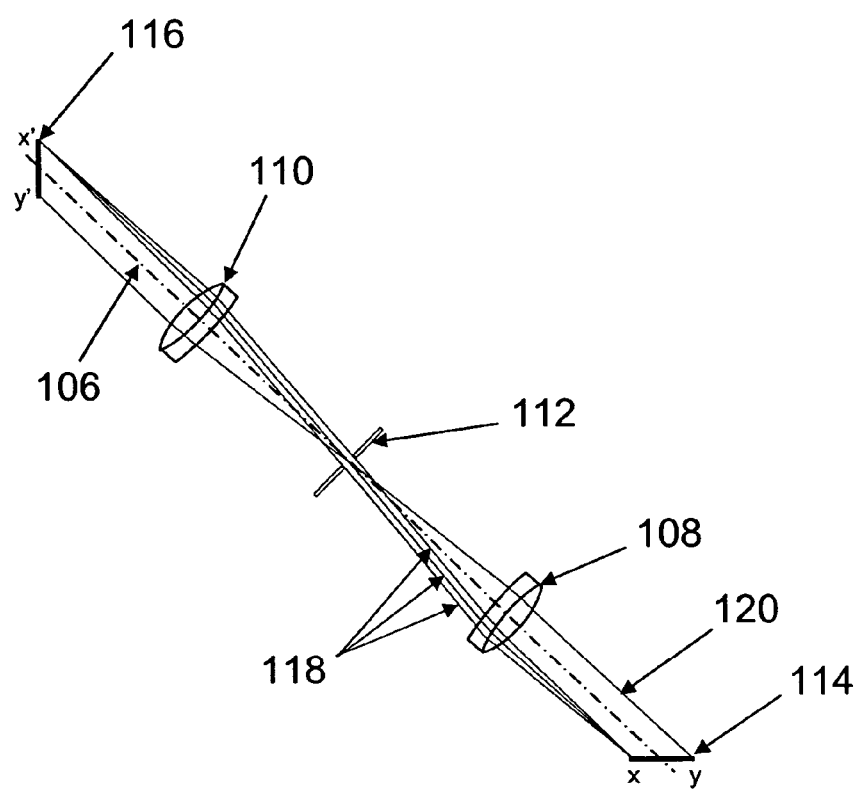
FIG. 4 is a schematic diagram of the imaging system of FIG. 3 with a few representative ray paths shown and with a few other features removed for clarity.

Referring now to FIG. 4, the lens configuration will now be explained more fully. This configuration is presented by way of example only and is not intended to be limiting. Other configurations will readily occur to those skilled in the art and are intended to be within the scope and spirit of the invention. In the configuration shown, aperture stop 112 is positioned at a focal point of the lens system and functions as a telecentric stop. As is well known to those skilled in the art, the telecentric configuration selects bundles of rays in which the principal rays 120 are parallel to the optic axis 106. A primary advantage of the telecentric configuration, widely used in metrology, is that the magnification of the optical system remains relatively constant as the object is shifted slightly away from the ideal focus. Specifically, aperture stop 112 is positioned at the second focal point of lens 108 and at the first focal point of lens 110. In this particular configuration, the lens has been designed to be symmetric about the aperture stop 112, and as such, the lens system is also telecentric in image space, i.e. at the sensor 116. The aperture diameter of aperture stop 112 controls the f-stop, and thus the numerical aperture, of the optical system. In one embodiment of the invention, the f-stop has been set at f/22.6, or equivalently a numerical aperture of 0.022.

Each point within the field of view 114 in object space is imaged by the lens system onto a corresponding point on the detector 116. For example, rays 118 from point x on the object are refracted by lens 108 forming a generally parallel bundle of rays that passes through aperture stop 112, are refracted again by lens 110 and are brought to a focus on detector 116 at point x'. Likewise, point y in object space is imaged onto point y' in image space. Since the field of view 114 in object space is tilted from optical axis 106, the image of the object in image space will also be tilted. Accordingly, detector 116 is also tilted from optical axis 106 to coincide with this tilted image. The theory describing the imaging principles of tilted objects, lenses and images was disclosed by Jules Carpentier in British Patent Publication No. GB 1139/1901. However, these principles are generally better known as Scheimpflug's Principle, having been well documented by Theodor Scheimpflug of Austria in British Patent Publication No. GB 1196/1904. These principles are particularly well known to those familiar with large format view cameras, which are designed to well exploit these principles. In one embodiment, in which the imaging system has a magnification of one, the angle between the optical axis and the top surface of the substrate is approximately equal to the angle between the optical axis and the detector plane of detector 116.

Figure 5:
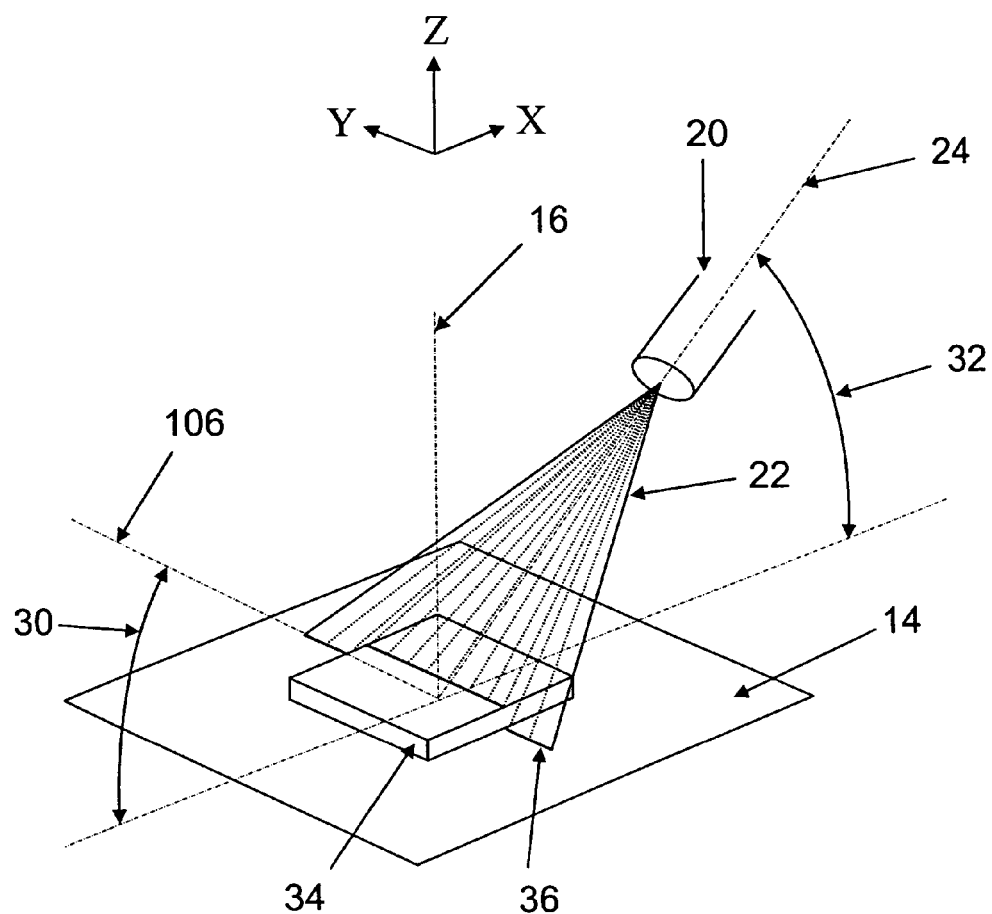
FIG. 5 is a perspective view of the laser source and the substrate of FIG. 2.

FIG. 5 depicts a fan of light 22 emitted from laser line generator 20 in accordance with one embodiment of the invention. The laser line generator 20 is mounted along laser axis 24, forming a fan of rays 22 which intersect the field of view along a line 36. The laser axis 24 is arranged within the dispensing system at a laser angle 32 relative to the top surface of substrate 14. Since the light 22 is projected onto the substrate 14 at a laser angle 32, changes in elevation such as that shown by a topology feature 34, cause a displacement in the X position of the line 36. Having been reflected from the top surface of the substrate 14 and the topology feature 34, some portion of the rays travel along the optical axis 106, arranged at the camera angle 30 from the substrate 14 and are viewed by the imaging system 100. For diffusely reflective surfaces, the reflected rays will emanate from the surface at a variety of angles. For specular surfaces, the reflected rays will reflect from the surface at an angle substantially equal to the angle of incidence. Thus, when configured for imaging generally specular surfaces, the laser angle 32 is arranged to be generally equal to the camera angle 30 of the imaging system 100.

Figure 6:
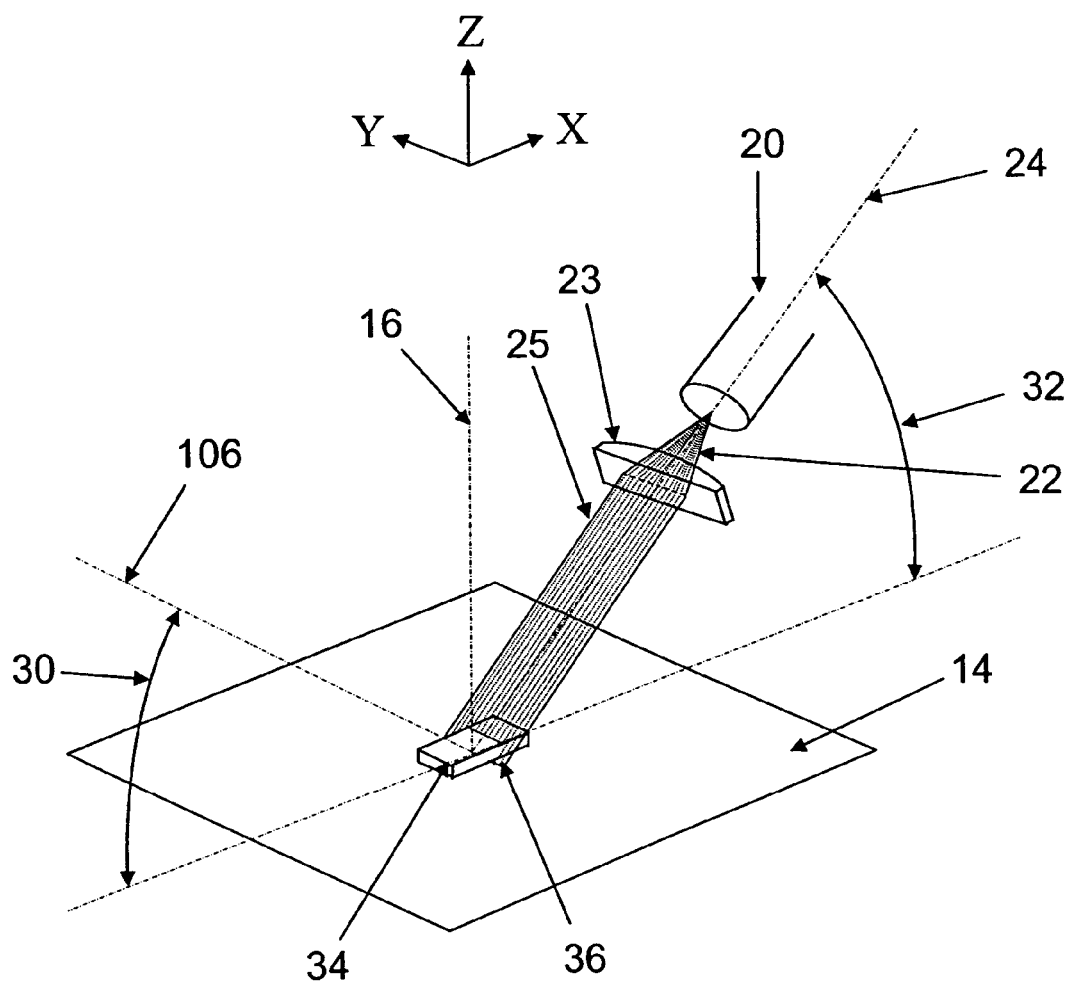
FIG. 6 is a perspective view of an alternate laser source configuration and the substrate of FIG. 2.

FIG. 6 depicts an alternate configuration of the laser source 20, in which the laser line generator 20 is directed at a cylindrical converging lens 23. Properly arranged, the fan of rays 22 emerges from the cylindrical converging lens 23 as a parallel collection of rays 25. Upon encountering the substrate 14, the parallel collection of rays 25 will form a line 36, in much the same manner as was described above in reference to FIG. 5. As in the description of FIG. 5 above, if the substrate 14 is a specular surface, then the rays will reflect from the surface at an angle substantially equal to the angle of incidence. Also, since the rays are parallel before reflection, they will remain parallel after reflection. As noted above in the description of FIG. 4, the lens assembly 104 in one embodiment of the present invention is telecentric and "sees" only those rays that are generally parallel to the optical axis. Thus, the parallel reflected rays will satisfy the conditions necessary to be seen by the imaging system 100 (not shown here).

Figure 7:
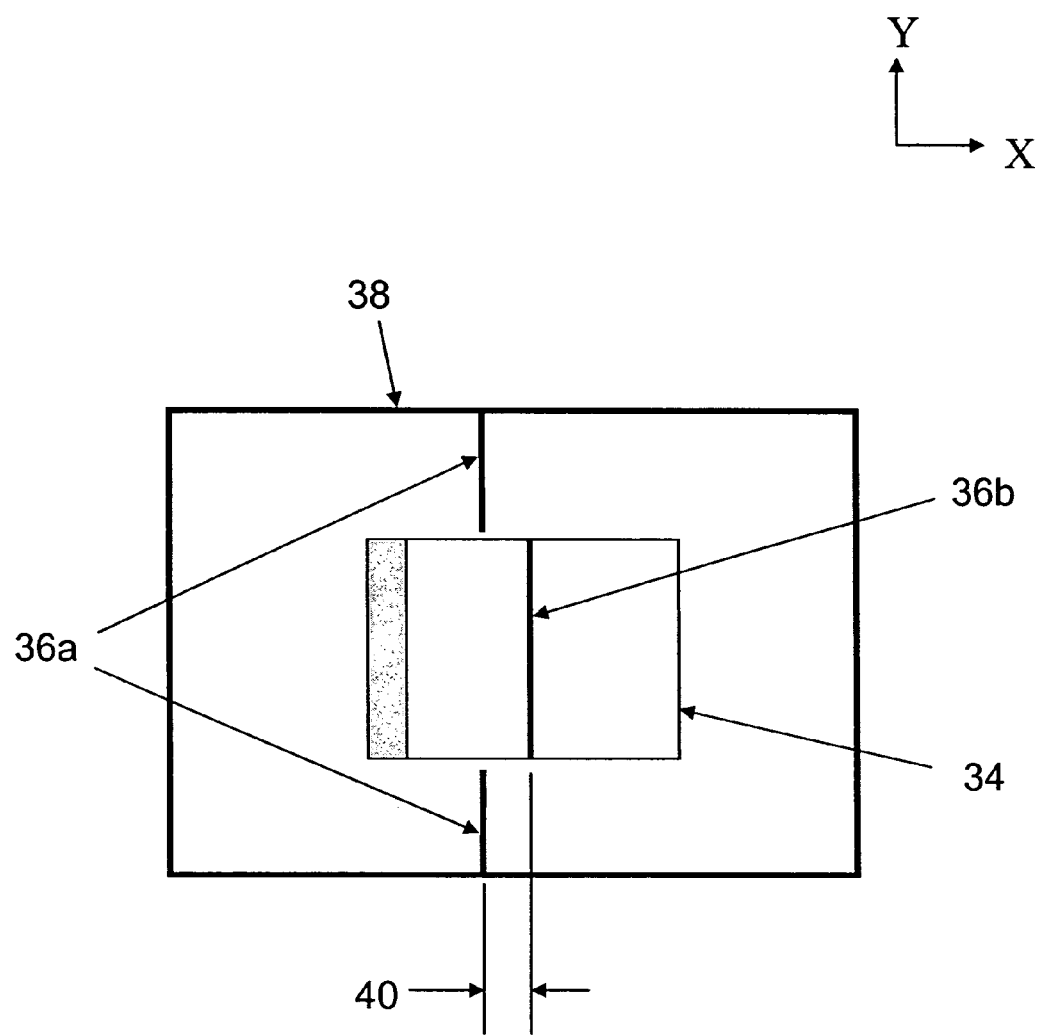
FIG. 7 is a diagram of the substrate of FIG. 4 as seen by the imaging system of FIGS. 1 thru 3.

Referring now to FIGS. 5 & 7, FIG. 7 presents a simplified image 38 of the scene depicted in FIG. 5 as seen by the camera 102 (not shown here). Seen in this image are lines 36*a* and 36*b* (collectively referred to as line 36). Line 36*a* results from light 22 that has encountered the substrate 14, while line 36*b* results from light 22 that has encountered the topology feature 34 located on the top surface of substrate 14. X displacement 40 is the combined result of the camera angle 30, the laser angle 32 and the height of the topology feature 34. The displacement 40 caused by the topology feature 34 is shown here by way of illustration only. In practice, the Z height of a substrate 14 may be determined by the X position of line 36 within image 38. For example, the imaging and dispensing portion 6 of dispenser platform 8 may be positioned above a height calibration target that is mounted at a known height. The X position of line 36 within the image 38 is determined by applying appropriate image processing techniques and algorithms. The resultant X position is recorded or otherwise saved for subsequent use. When the dispensing and imaging portion 6 is later positioned over a substrate 14 of unknown height, the position of line 36 within image 38 is again determined. The resultant X position is compared with the value measured at the calibration surface and the difference is used to compute the height of the top surface of the substrate 14. In other words, the displacement 40 may be measured between different instances of image 38 and need not be generated within one scene by a feature 34. The configuration of FIG. 6 would also result in an image as seen in FIG. 7.

Figure 8:
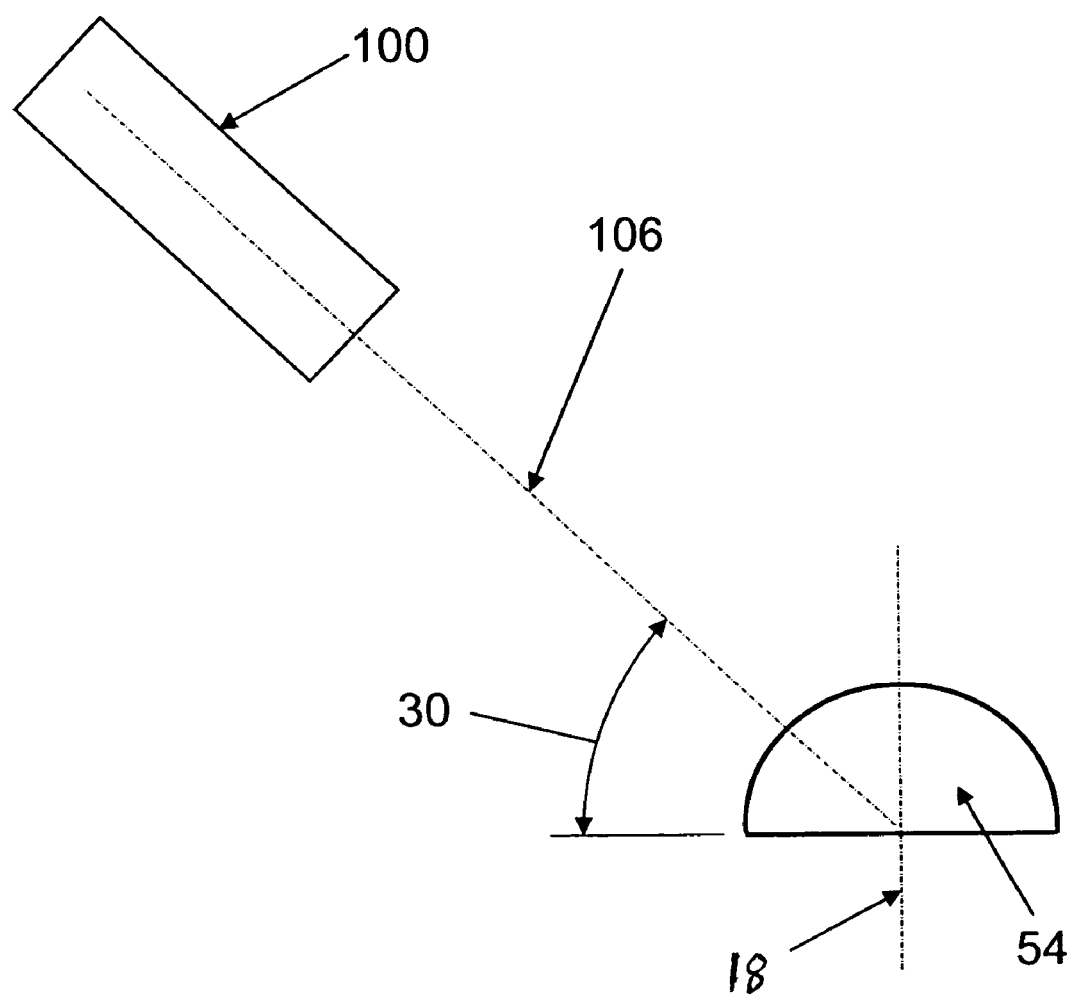
FIG. 8 depicts a hemispherical dot being viewed by the imaging system.

FIG. 8 depicts an imaging system 100 viewing a hemispherical dot of material 54 from a camera angle 30 along an optical axis 106. The dot of material 54 may have been dispensed from, for example, dispenser 10 onto substrate 14. Dispenser motion axis 18 is shown for reference. This figure provides the context for better understanding the next figure.

Figure 9:
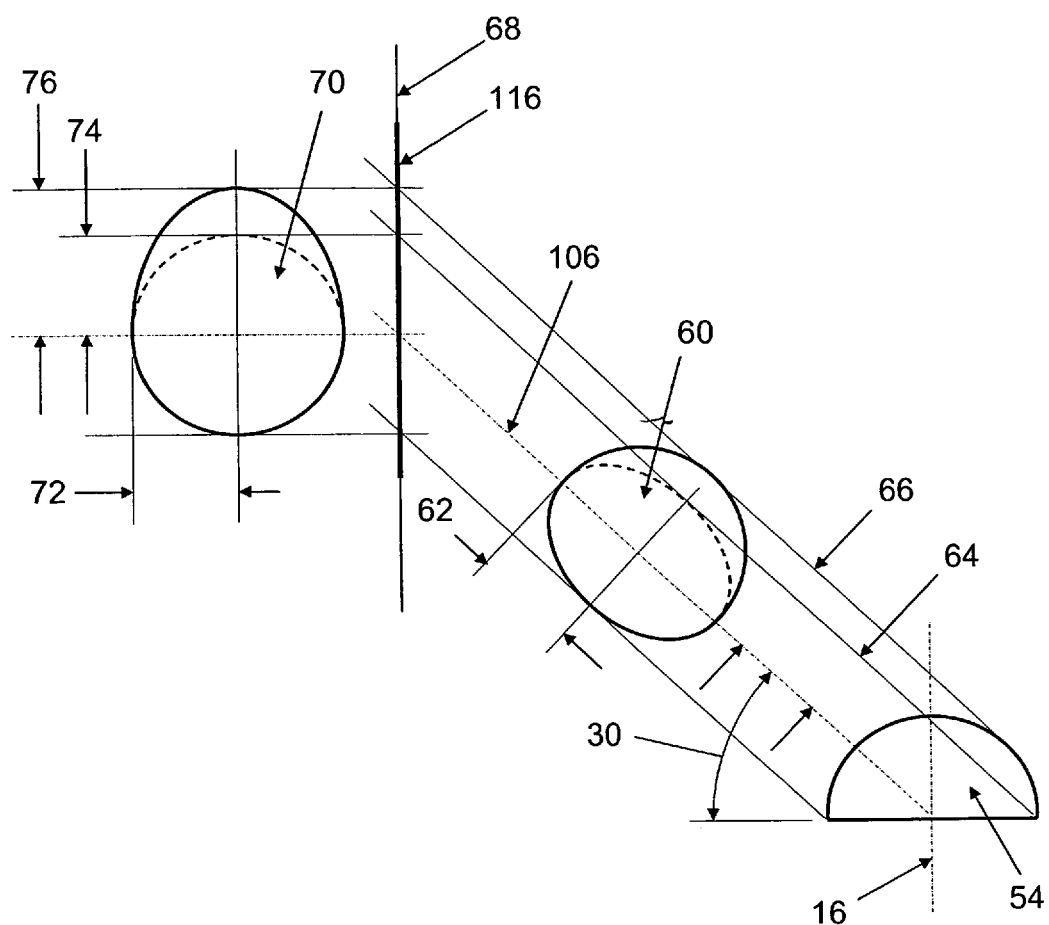
FIG. 9 depicts the hemispherical dot of FIG. 8 as seen by the imaging system.

FIG. 9 depicts the hemispherical dot 54 of FIG. 8 as seen by the imaging system 100. As shown in this figure, the hemispherical dot 54, when viewed from a camera angle 30, would normally appear in a foreshortened form 60, with an apparent base radius 62, a foreshortened base radius 64, and an apparent height 66. Since the dot is hemispherical, the height of the dot is equal to the base radius, and thus the apparent height 66 will be substantially equal to the apparent base radius 62. The foreshortened base radius 64 is equal to the apparent base radius 62 multiplied by the trigonometric sine of camera angle 30. However, as noted in the description of FIG. 4 above, the detector 116 is tilted relative to the optical axis 106. As shown here, the detector 116 lies in detector plane 68. When the projected form 60 of the hemispherical dot 54 is projected onto the detector plane 68, the foreshortening effect is "undone". In the process of this projection, an effective scaling takes place in one dimension, wherein the scale factor is equal to (1/(sine of camera angle 30)). Thus, as seen by imaging system 100 and represented here as dot image 70, a first projected radius 72 is equal to a second projected radius 74. The projected height 76 is also scaled by the same proportion, and here appears equal to the projected base radius 72 or 74 multiplied by the scale factor.

In typical operation of the present invention, appropriate image analysis techniques are applied to determine the measured radius and height values. These measured values thus extracted permit the dispensing system to monitor the dispense process for dot presence or absence, dot diameter and dot height. Dots formed of various dispensed materials tend to have dot shape profiles that are characteristic for the material and the equipment configuration. For example, one material and equipment configuration might produce hemispheres while another produces conical forms. If a shape factor is either known or assumed, the dot's volume may be estimated from the radius and height information. The measured values for radius, height, and the estimated volume may be compared against predetermined boundaries, recorded and saved for subsequent use or otherwise analyzed and interpreted to monitor the dispensing process. Thus, by incorporating at least one embodiment of the present invention into a dispensing system, it becomes practical to perform an inspection of every dispense operation.

Figure 10A:
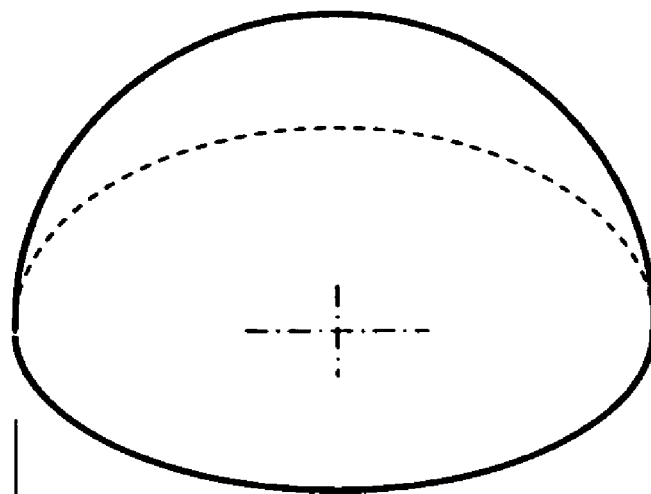
FIGS. 10a and 10b represent a simplified comparison between the "normal" foreshortened image of a dot, as might been seen by eye and the projected image as captured by the imaging system of one embodiment of the present invention.
Figure 10B:
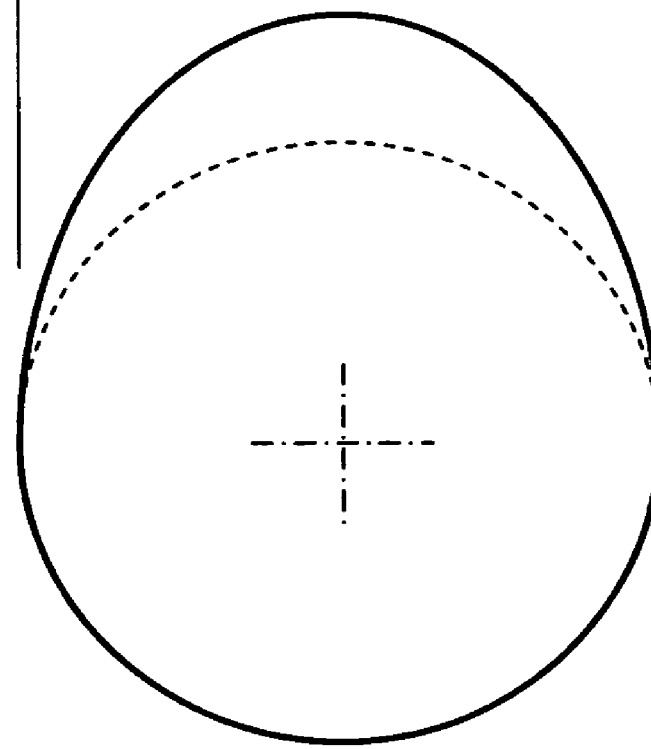

FIGS. 10a and 10b represent a simplified comparison between the "normal" foreshortened image 10a of the dot, as might be seen by the eye for example, and the projected image 10b as captured by the imaging system of embodiments of the present invention. The projected image 10b provides a convenient form for image processing purposes, in that the shape and proportions of objects in the plane of the substrate are preserved (e.g. circular features such as dots are seen as circles). It should be apparent, however, that the captured image may be further processed to again impose the scaling factor. The resulting foreshortened image 10a, thus reconstructed, might be more appropriate and more familiar, for example, if the image is to be displayed for viewing by a human. The shape of FIG. 10b will be apparent in the dot images of FIGS. 11 through 14.

Figure 11:
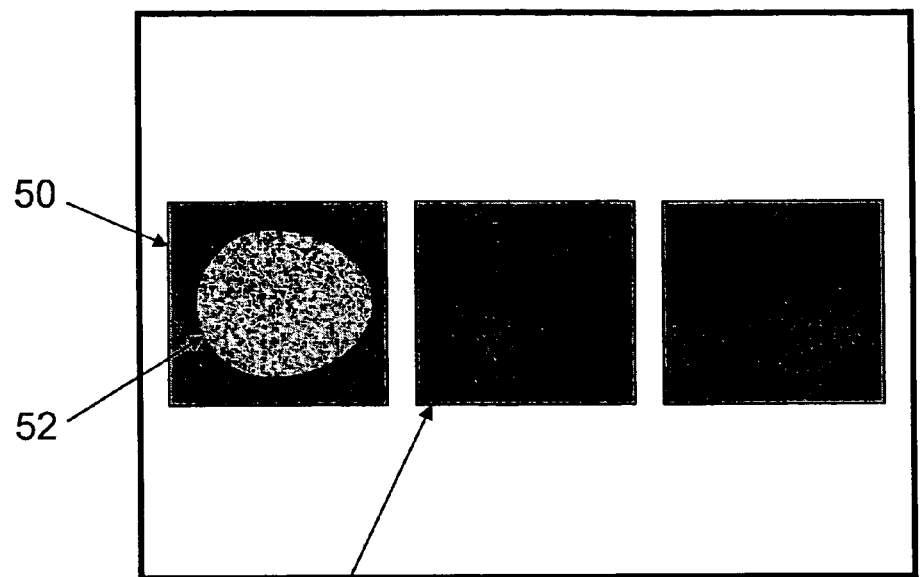
FIG. 11 represents a simplified image of three circuit board interconnect pads as might be seen by the imaging system of one embodiment of the present invention.

FIG. 11 represents a simplified image of three circuit board interconnect pads as might be seen by the imaging system of the present invention. This image represents a "before" image, e.g. showing an electronic interconnect pad 54 just before the needle dispenses a quantity of material. As shown on the left side of this figure, pad 50 has already had a dot of material 52 dispensed upon it.

Figure 12:
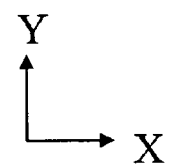
FIG. 12 represents the same scene as FIG. 11 after a dot of material has been dispensed on a center pad.
Figure 12:
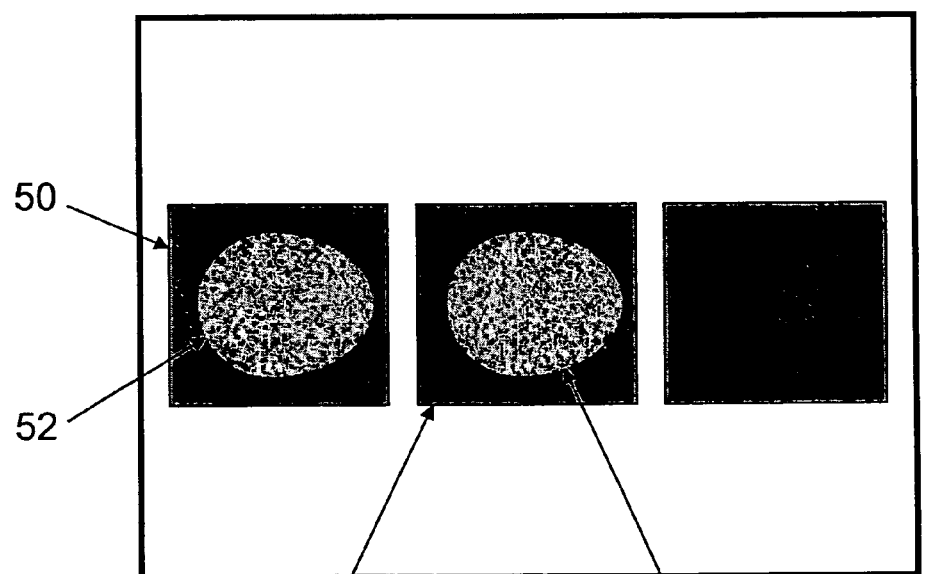

FIG. 12 represents the same scene as shown in FIG. 11, except that here it is shown after a dot of material 56 has been dispensed upon pad 54.

Figure 13:
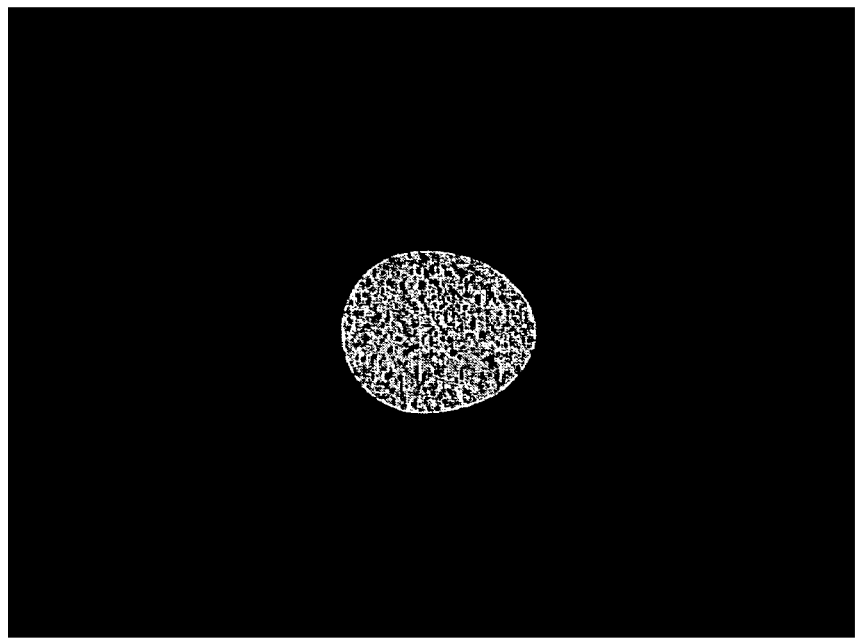
FIG. 13 represents the difference between FIG. 11 and FIG. 12.

FIG. 13 represents the result of subtracting the image of FIG. 11 from the image of FIG. 12. Such image subtraction techniques are well known to those skilled in the art. It may be noted that the detail in the background of FIGS. 11 & 12, provided it remains constant from one scene to the next, will be eliminated by the subtraction operation. Since the new dot of material (54 in FIG. 12) is the only portion of the image that changed between FIGS. 11 & 12, the image of dot 54 is the only significant detail that survives the image subtraction process. If the imaging system 100 is to be used for viewing both light materials against dark backgrounds and dark materials against light backgrounds, then following this image subtraction step with an absolute value operation will help to ensure that those portions of the image associated with the dot are represented by positive numbers. Those portions of the image associated with background are represented by values at or near zero.

Figure 14:
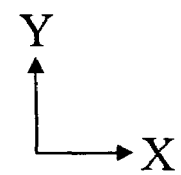
FIG. 14 represents a processed version of FIG. 13 and identifies some of the significant dimensions of the dot image as captured by the imaging system and as extracted by the image processing methods of one embodiment of the present invention.
Figure 14:
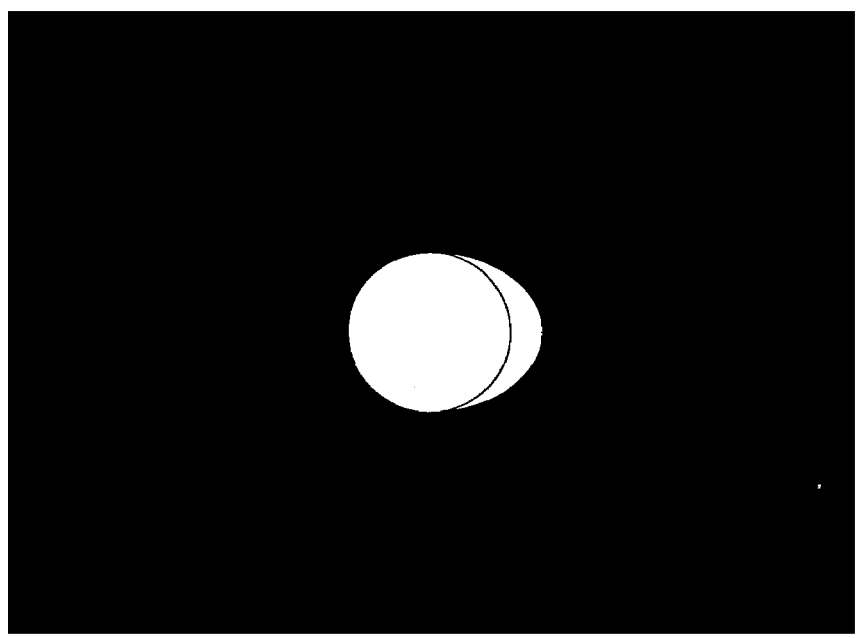

FIG. 14 represents the image of the dot from FIG. 13 after further image processing to discriminate between the dot and the background. In some embodiments of the invention, this image processing step may be as simple as comparing the image pixel data against a threshold value. All pixels with values equal to or greater than the threshold value are considered to be "dot" pixels, while all other pixels, those with values below the threshold value, are considered to be background pixels. This example provides at least one image processing method by which the foreground dot may be differentiated from the background. Other methods will readily occur to those skilled in the art.

Figure 15:
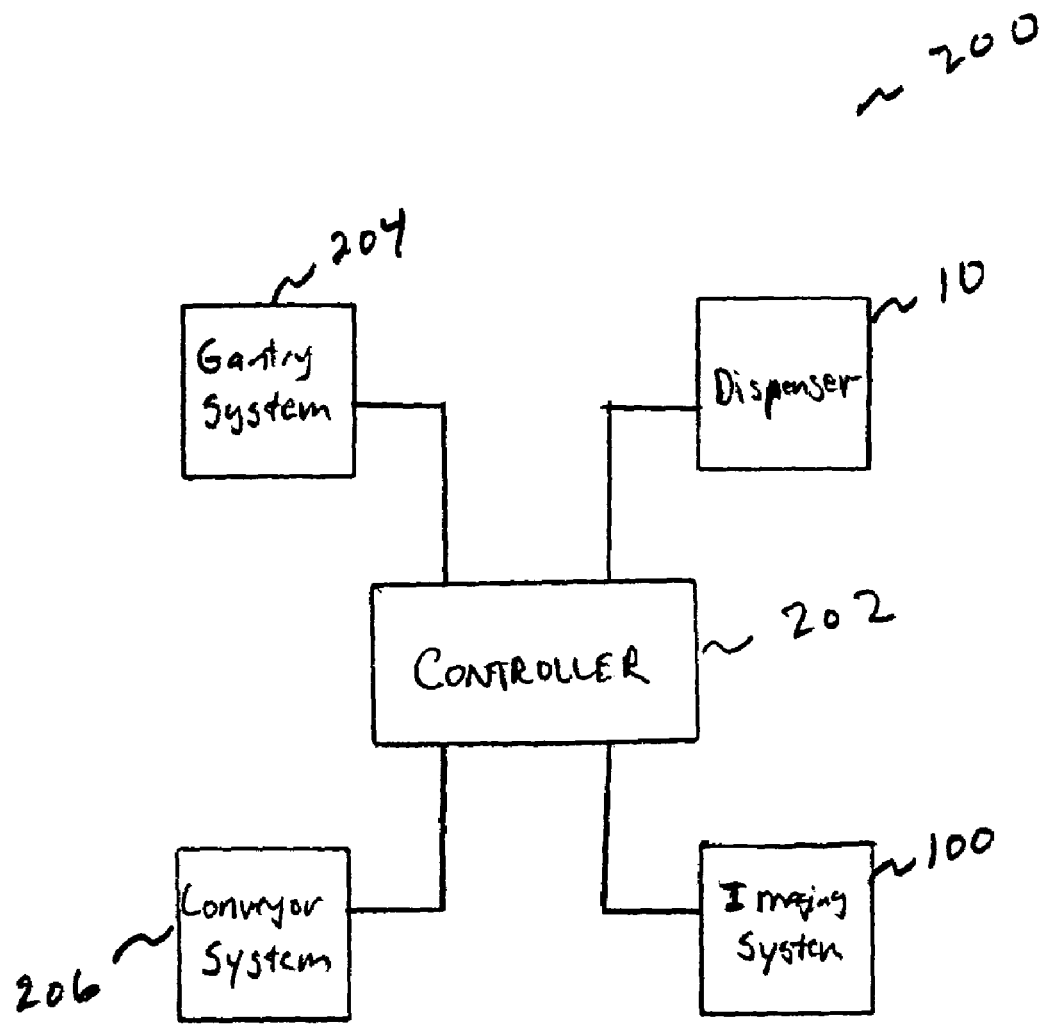
FIG. 15 is a functional block diagram of a dispensing system in accordance with one embodiment of the present invention.

FIG. 15 shows a functional block diagram of a dispensing system 200 that incorporates apparatus and methods of the invention discussed above. The dispensing system 200 includes a controller 202 coupled to each of a gantry system 204, a conveyor system 206, the dispenser 10, and the imaging system 100. The controller functions as the main controller of the dispensing system and in one embodiment may be implemented using a general purpose computer, such as those incorporating Pentium processors and commonly referred to as personal computers. The conveyor system 206 is controlled by the controller and is used to position substrates, such as substrate 14, to a dispensing position in the dispensing system 200. The gantry system 204 is used, under control of the controller, to position the dispenser 10 and the camera and lens assembly 100 over substrates located at the dispensing position. The gantry system may include, for example, gantry beam 2 and gantry rails 4 discussed above with reference to FIG. 1.

Figure 16:
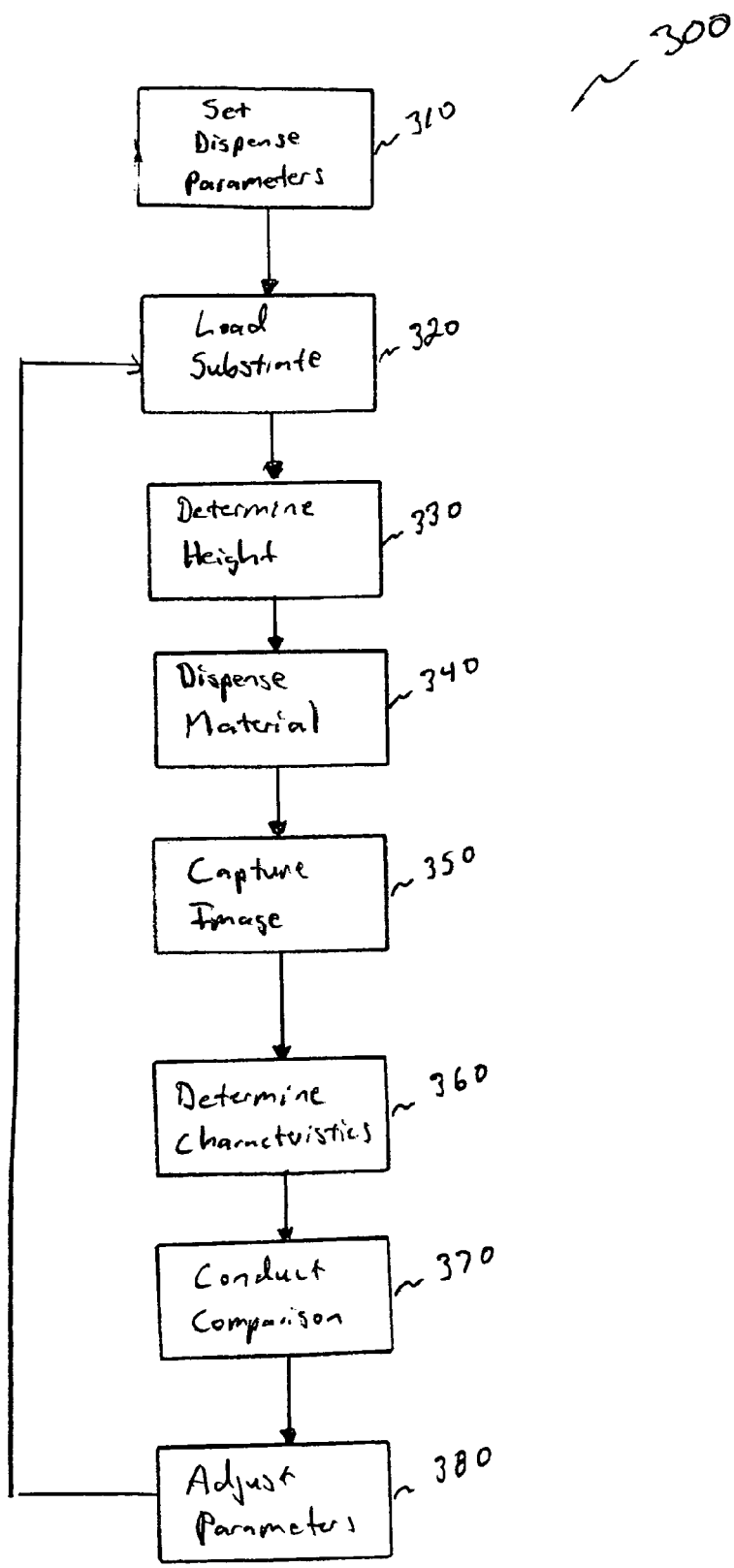
FIG. 16 is a flow chart showing a method of dispensing material in accordance with one embodiment of the present invention.

A process 300 for operating the dispensing system 200 will now be described with reference to FIG. 16. At an initial point 310 in the process, dispense parameters for the dispenser are set. The parameters may be set, for example, by a user through a user interface with the controller. A substrate 14 is then loaded 320 onto the conveyor system and moved to the dispense point in the dispensing system. At point 330 in the process, the gantry system is used to position the imaging system 100 over one or more dispense points on the substrate, and the height of the substrate at each dispense point is determined using the imaging system 100 in conjunction with the controller 202. In embodiments of the invention, the controller may include one or more of a number of vision inspection programs available from Cognex Corporation of Natick, Mass. and Matrox Imaging of Dorval, Canada.

The dispenser 10 is then moved by the gantry system under control of the controller to each dispense point where a quantity of material is dispensed 340 from the dispenser onto the substrate. Prior to dispensing the material, the dispenser may be positioned at a predetermined height above the substrate using the height information obtained at point 330 of the process 300.

At step 350, the imaging system 100, again in conjunction with the controller 202, captures an image of at least one dot of material dispensed be the dispenser. The camera and lens assembly may be controlled to capture the image immediately after dispensing occurs, while the camera and lens assembly is in position to view the dot of material. In other embodiments, a detection height of the camera and lens assembly may be different from a dispense height for the dispenser. In such embodiments, the camera and lens assembly may be raised or lowered to the detection height prior to image capture.

At point 360 in the process the controller determines characteristics of the dispensed material using at least one of the processes described above. Next at point 370, the characteristics of the material are compared with acceptable limits, and a determination is made as to whether the substrate passes the inspection process or must be reworked. In addition, in some embodiments of the invention at point 380, a closed-loop feedback process is used to control parameters of the dispenser based on the characteristics of the dispensed dot. If the characteristics are outside acceptable limits, or close to being unacceptable, parameters of the dispenser may be adjusted to correct any such errors. Particular parameters to be adjusted will depend on the type of dispenser being used, but may include, on-time of the dispenser, dispense height, and pressure of material in the dispenser. After the parameters have been adjusted, the process returns to point 320 where a new substrate is loaded into the system.

In one embodiment of the invention, process 300 described above may be modified to incorporate image subtraction techniques discussed above with reference to FIGS. 11-14. In this embodiment, an image of the substrate is captured prior to dispensing and is subtracted from the image captured after dispensing.

In one embodiment discussed above an adhesive and/or solder paste is dispensed onto a circuit board. In other embodiments, other materials may be dispensed onto substrates other than circuit boards. Further, while dispensing is described as occurring after a dispenser has been positioned at a dispensed point, embodiments of the invention may also be used with dispensers that dispense "on the fly" while the dispenser is in motion, such that forward momentum of a dispensed dot causes the dot to be dispensed at a point not below the dispenser at the time of dispensing.

Imaging systems of the present invention may be used in conjunction with other calibration and inspection systems to provide complete calibration and closed loop control of a dispenser. For example, the imaging system may be used in conjunction with a weigh scale calibration system, such as that disclosed in U.S. Pat. No. 6,541,063, entitled "Calibration of a Dispensing System," which is incorporated herein by reference. In such a combined system, the weigh scale system and the imaging system may both be used to determine parameters of dispensed materials for calibrating and controlling a dispensing system.

In dispensing systems, it is generally desirable to eliminate the lateral offset between the point of dispense and the center of the field of view of the inspection vision system. It is further desirable to eliminate the lateral offset between the point of dispense and the point of height measurement. In at least one embodiment of the invention, by eliminating these lateral offsets and the consequential move times, the throughput speed of a dispensing system can be increased. Indeed, by eliminating these lateral offsets and the consequential move times, it becomes practical to perform a substrate height measurement prior to every dispense operation. It likewise becomes practical to perform an inspection of every dispense operation.

Furthermore, elimination of the lateral offset between the vision system and the point of dispense permits the mapping operation to be performed at the point of dispense, thus eliminating the major cause of Abbe errors.

In at least one embodiment of the present invention, by tilting the optic axis of the vision inspection system away from the substrate surface normal, the center of the vision field of view can be constructed and arranged to coincide with the point of dispense. In at least one other embodiment of the present invention, a laser light source is incorporated to permit non-contact measurement of the height of the substrate at or near the point of dispense.

Having thus described at least one embodiment of the present invention, various alterations, modifications and improvements will readily occur to those skilled in the art. Such alterations, modifications and improvements are intended to be within the scope and spirit of the invention. Accordingly, the foregoing description is by way of example only and is not intended to be limiting. The invention's limit is defined only in the following claims and the equivalents thereto.

What is claimed is:

1. A dispensing system for dispensing materials onto a substrate, the dispensing system comprising:
   a dispenser having a dispensing outlet positionable and moveable over a top surface of the substrate, the dispenser having a substantially vertical dispensing axis along which material from the dispenser is dispensed;
   a vision system, mechanically coupled to the dispenser, the vision system being positionable to obtain images of the top surface of the substrate along an optical axis, wherein the vision system is constructed and arranged such that the optical axis intersects the dispensing axis, the vision system including a telecentric lens configuration, the vision system being configured to obtain two-dimensional images of the top surface of the substrate; and
   a controller coupled to the dispenser and the vision system, the controller being configured to control dispensing parameters of the dispenser and to control the vision system and acquire images from the vision system, the controller and the vision system being configured to capture an image of a drop of material dispensed onto the substrate and to determine at least one parameter of the drop of material, the controller being configured to compare at least one parameter with a predetermined boundary for the at least one parameter to obtain a comparison result and to adjust the dispensing parameters based on the comparison result.

2. The dispensing system of claim 1, further comprising a light source mechanically coupled to the dispenser and constructed and arranged to direct light along an illumination axis that intersects the dispensing axis and the optical axis.

3. The dispensing system of claim 2, wherein the dispensing system is constructed and arranged such that the top surface of the substrate at a dispensing position in the dispensing system is substantially horizontal and an angle between the optical axis and the top surface of the substrate is substantially equal to an angle between the illumination axis and the top surface of the substrate.

4. The dispensing system of claim 3, wherein the light source is configured to generate a fan of rays along a line on the top surface of the substrate.

5. The dispensing system of claim 3, wherein the light source is configured to generate a parallel set of rays.

6. The dispensing system of claim 5, wherein the light source includes a laser.

7. The dispensing system of claim 3, further comprising a gantry system coupled to the dispenser and the vision system to position the dispenser and the vision system over the top surface of the substrate.

8. The dispensing system of claim 1, wherein the controller and the vision system are configured to measure a height of at least one point on the top surface of the substrate.

9. The dispensing system of claim 1, wherein the controller and the vision system are configured to capture an image of a drop of material dispensed onto the substrate and to determine at least one parameter of the drop of material.

10. The dispensing system of claim 9, wherein the at least one parameter is at least one of a height of the drop, a diameter of the drop, a volume of the drop, and a location of the drop on the substrate.

11. A dispensing system for dispensing materials onto a substrate, the dispensing system comprising:
    a dispenser having a dispensing outlet positionable over a top surface of the substrate, the dispenser having a substantially vertical dispensing axis along which material from the dispenser is dispensed;
    a vision system mechanically coupled to the dispenser, the vision system being positionable to obtain images of the top surface of the substrate along an optical axis, wherein the vision system is constructed and arranged such that the optical axis intersects the dispensing axis, wherein the vision system includes a telecentric lens configuration, the vision system being configured to obtain two dimensional images of the top surface of the substrate, wherein the vision system includes a detector having a detector plane that forms a first acute angle with the optical axis, and wherein the first acute angle is substantially equal to a second acute angle between the optical axis and the top surface of the substrate;
    a light source coupled to the dispenser and constructed and arranged to direct light along an illumination axis that intersects the dispensing axis and the optical axis;

a gantry system coupled to the dispenser and the vision system to position the dispenser and vision system over the top surface of the substrate; and a controller coupled to the dispenser and the vision system, wherein the controller and the vision system are configured to capture an image of a drop of material dispensed onto the substrate and to determine at least one parameter of the drop of material.

12. A dispensing system for dispensing materials onto a substrate, the dispensing system comprising:

a dispenser having a dispensing outlet positionable over a top surface of the substrate, the dispenser having a substantially vertical dispensing axis along which material from the dispenser is dispensed; and a vision system, mechanically coupled to the dispenser, the vision system being positionable to obtain images of the top surface of the substrate along an optical axis, wherein the vision system is constructed and arranged such that the optical axis intersects the dispensing axis, wherein the vision system includes a detector having a detector plane that forms a first acute angle with the optical axis, wherein the first acute angle is substantially equal to a second acute angle between the optical axis and the top surface of the substrate, and wherein the vision system includes a telecentric lens configuration and is capable of capturing two dimensional images of the top surface of the substrate.

* * * * *